US006714094B1

(12) United States Patent
Gill

(10) Patent No.: US 6,714,094 B1
(45) Date of Patent: Mar. 30, 2004

(54) BALUN

(75) Inventor: Hardial Gill, Backnang (DE)

(73) Assignee: Marconi Communications GmbH, Backnang (DE)

(*) Notice: Subject to any disclaimer, the term of this patent is extended or adjusted under 35 U.S.C. 154(b) by 0 days.

(21) Appl. No.: 10/088,365

(22) PCT Filed: Sep. 12, 2000

(86) PCT No.: PCT/IB00/01366

§ 371 (c)(1), (2), (4) Date: Jul. 11, 2002

(87) PCT Pub. No.: WO01/20708

PCT Pub. Date: Mar. 22, 2001

(30) Foreign Application Priority Data

Sep. 14, 1999 (DE) ........................................ 199 43 955

(51) Int. Cl.[7] .................................................. H03H 7/42
(52) U.S. Cl. ........................................... 333/26; 333/25
(58) Field of Search ............................ 333/25, 26, 116, 333/238

(56) References Cited

U.S. PATENT DOCUMENTS 4,739,289 A * 4/1988 Cripps ......................... 333/26

FOREIGN PATENT DOCUMENTS

| | | |
|---|---|---|
| EP | 0 419 756 A2 | 4/1991 |
| EP | 0 844 684 A1 | 5/1998 |
| EP | 0 853 377 A2 | 7/1998 |
| EP | 0 866 513 a2 | 9/1998 |
| WO | WO 01/20708 A1 | 3/2001 |

OTHER PUBLICATIONS

*A New Design Procedure for Single–Layer and Two–Layer Three–Line Baluns*, Choonsik Cho., Student Member, IEEE, et al., IEEE Transactions on Microwave Theory and Techniques, vol. 46, No. 12, Dec. 1998, pp. 2514–2519.

* cited by examiner

*Primary Examiner*—Robert Pascal
*Assistant Examiner*—Dean Takaoka
(74) *Attorney, Agent, or Firm*—Kirschstein, et al.

(57) ABSTRACT

A balun, which takes up very little space and which is economical to produce, consist of four interconnected planar lines. One end of a first line is configured as a first symmetrical terminal. The other end of the first line is connected to the adjacent end of the second adjacent line. The end of the second line that is connected to the first line forms an unsymmetrical terminal, while the other end of the second line is connected to ground. The end of the third line, which is adjacent to the second line, is connected to ground, this end being adjacent to the unsymmetrical terminal. The other end of the third line serves as a second symmetrical terminal. The end of the fourth line that is adjacent to the second symmetrical terminal is connected to ground, the other end being connected to the end of the second line that forms the unsymmetrical terminal.

2 Claims, 1 Drawing Sheet

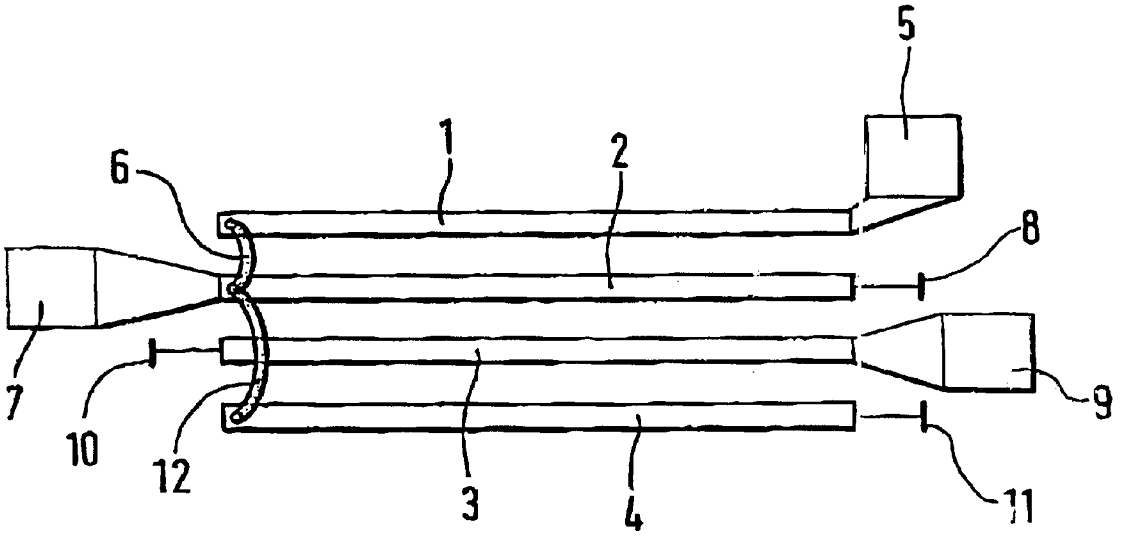
5
1
2
6
8
7
10
12
9
3
4
11

BALUN

BACKGROUND OF THE INVENTION

The present invention concerns a balun, consisting of four coupled planar lines running next to each other, with an unbalanced connection gate and two balanced connection gates.

Baluns are known to be transitions between balanced and unbalanced transmission lines. A balanced line exists when a signal being transmitted over it does not have ground as reference potential. On the other hand, an unbalanced transmission line is connected on one side to ground, so that a signal being transmitted over it has ground as reference potential. Baluns of this type are used, for example, at the inputs and outputs of quadruplex mixers or amplifiers or modulators, etc.

The balun just mentioned, consisting of four planar lines connected to each other, is known from DE 197 29 761 A1. This balun consists of two 3 dB couplers, each of which consist of two planar lines coupled over a length of λ/4. Each of the two couplers is designed in the form of a two-pole band pass filter, in which one is configured in an open circuit configuration and the other in a short circuit configuration. The two quarter-wavelength couplers are connected to each other so that a three-gate balun is produced, having one connection for unbalanced signals and two connections for balanced signals. The opposite ends of the two lines in the line coupler in the open circuit configuration are at no-load. Another end of the two lines serves as balanced connection. The opposite end of the other line is connected to one end of one of the two line couplers designed in the short circuit configuration. Two opposite ends of the two lines are contacted with ground from this line coupler, and another end of a line forms an additional connection for balanced signals. The two line ends of the two line couplers connected to each other form the connection gate for unbalanced signals. In order to achieve a narrow 3 dB coupling between the lines, the balun is designed in multilayer technology. The manufacturing cost is therefore high, which is unfavorable for mass production.

SUMMARY OF THE INVENTION

The underlying task of the invention is to provide a space-saving balun that is as simple as possible to manufacture.

This type of balun is constructed as follows according to the features of claim 1. One end of a first of four lines serves as a first balanced connection gate. The other end of this first line is connected to the end of the second line adjacent to it. The end of the second line connected to the first line forms the unbalanced connection gate, and the other end of the second line lies at ground potential. The end of the third line lying next to the unbalanced connection gate adjacent to the second line is contacted with ground, and the other end of the third line serves as second balanced connection gate. The end of the fourth line lying next to the second balanced connection gate adjacent to the third line is contacted with ground, and the other end of the fourth line is connected to the end of the second line forming the unbalanced connection gate.

According to a subclaim, the coupling length of the four lines corresponds to roughly one-fourth the average operating wavelength of the balun.

BRIEF DESCRIPTION OF THE DRAWING

The sole FIGURE is a view of a preferred embodiment of the invention.

DETAILED DESCRIPTION OF THE PREFERRED EMBODIMENT

The balun depicted in the drawing consists of four planar lines 1, 2, 3 and 4 running next to each other. The line length, over which the lines 1, 2, 3 and 4 are coupled to each other, amounts to about one-fourth of the average operating wavelength of the balun.

One end of the first line 1 is designed as connection gate 5 for the balanced signal. The other end of the first line 1 is connected conducting to the end of the second line 2 adjacent to it via an air bridge 6. The same end of the second line 2 is designed as connection gate 7 for unbalanced signals. The end of the second line 2 opposite this connection gate 7 is contacted with ground 8. The short-circuit to ground is accomplished in known fashion by means of contacting in the substrate carrying the planar lines 1, 2, 3, 4 to a ground surface applied to the bottom of the substrate.

The end of the third line 3, adjacent to the ground short-circuit 8 of the second line 2 from the third line 3 running next to the second line 2, is designed as a second balanced connection gate 9. The end of the third line 3 opposite this connection gate 9 is provided with a ground connection 10.

The end of the fourth line 4 adjacent to the connection gate 9 of the third line 3 is also provided with a ground contact 11. The end of the fourth line 4 opposite this ground contact 11 is connected to the end of the second line 2 via an air gap 12, which is designed as an unbalanced connection gate 7.

Deviating from the practical example depicted in the drawing, the two ends of lines 2 and 4 lying at ground potential can be contacted with each other via an air gap. One of the two contacts 8, 11 can then be saved for the ground line.

What is claimed is:

1. A balun, comprising: four coupled planar lines running next to each other; one end of a first of the lines serving as a first balanced connection gate; the other end of the first line being connected to one end of a second of the lines adjacent to the other end of the first line; the one end of the second line being connected to the first line and serving as an unbalanced connection gate; the other end of the second line being connected to ground; one end of a third of the lines lying next to the unbalanced connection gate and being connected to ground; the other end of the third line serving as a second balanced connection gate; one end of a fourth of the lines lying next to the second balanced connection gate and being connected to ground; and the other end of the fourth line being connected to the one and of the second line forming the unbalanced connection gate.

2. The balun according to claim 1, wherein the four lines have a coupling length which corresponds to roughly one-quarter of an average operating wavelength of the balun.

* * * * *

UNITED STATES PATENT AND TRADEMARK OFFICE

CERTIFICATE OF CORRECTION

PATENT NO. : 6,714,094 B1
APPLICATION NO. : 10/088365
DATED : March 30, 2004
INVENTOR(S) : Gill It is certified that error appears in the above-identified patent and that said Letters Patent is hereby corrected as shown below:

In Column 2, Line 57, in Claim 1, delete “and” and insert -- end --, therefor.

Signed and Sealed this

Fourth Day of November, 2008

JON W. DUDAS
*Director of the United States Patent and Trademark Office*